July 14, 1964 C. B. WATTS, JR 3,141,144

PRINTED CIRCUIT DELAY LINE

Filed Feb. 10, 1961

INVENTOR.
Chester B. Watts, Jr.
BY
Bacon & Thomas
ATTORNEYS

United States Patent Office 3,141,144
Patented July 14, 1964

3,141,144

PRINTED CIRCUIT DELAY LINE

Chester B. Watts, Jr., Alexandria, Va., assignor to Scanwell Laboratories, Inc., Springfield, Va., a corporation of Virginia Filed Feb. 10, 1961, Ser. No. 88,519
4 Claims. (Cl. 333—30)

This invention relates to the transmission of electric waves in a printed circuit strip-line, and more specically to the rapid control of the time delay encountered by a signal propagating through a printed circuit strip transmission line.

It is sometimes desirable, in microwave systems, to be able, in response to a control current, to change the delay or R.F. phase of a signal without at the same time causing appreciable amplitude change. This has been done in a variety of ways by devices known customarily as variable delay lines or phase-shifters. It is ordinarily possible to classify such devices as either electro-mechanical or as non-mechanical in nature. The electro-mechanical types ordinarily have good electrical characteristics but are slow to change the delay in response to a control current.

It is an object of this invention to provide an electro-mechanical type of variable delay device in a printed circuit strip-line, wherein the required mechanical motion is very small, and the mass of the moving part is also very small, thereby permitting relatively rapid changes in the R.F. delay in response to a control current.

One embodiment of this invention provides a printed circuit strip-line wherein the usual ground plane foil is interrupted for some distance, and replaced by a flexible metal diaphragm. The diaphragm supports a driving coil immersed in the field of a permanent magnet, the combination permitting motion to be imparted to the diaphragm after the fashion of an electrodynamic loudspeaker. Connected in series with the conductor strip are a number of printed inductance elements alternated with printed capacitor plates which are in close proximity to the flexible diaphragm ground plane, thus forming an artificial transmission line structure having constant inductance per section, and variable capacitance per section.

Other objects and embodiments will become apparent to those skilled in the art as the description proceeds with reference to the accompanying drawings, wherein.

Figures 1, 2:
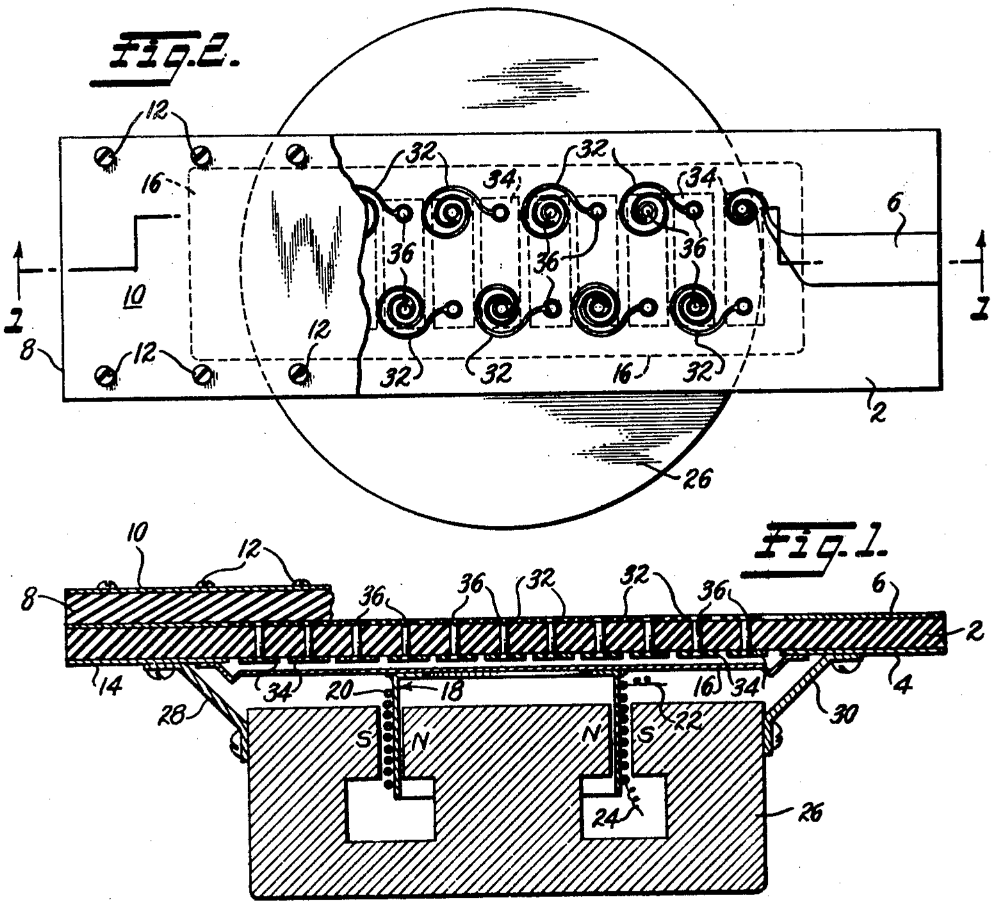
FIG. 1 is a side view, partially cut away, of a device which embodies this invention.
FIG. 2 is a top view of the same device.

The device may be described in more detail with reference to FIG. 1 and FIG. 2 as follows: a strip transmission line is shown comprising dielectric board 2 to which is cemented or otherwise secured a metal ground-plane foil 4 and a conductor foil 6. Dielectric cover 8 with cemented-on upper ground plane foil 10 is fastened to board 2 with bolts 12. Parts 8, 10 and 12 are not fundamentally required, but do serve to provide a shielding cover which reduces R.F. leakage. Ground-plane foil 14 is a continuation of ground-plane foil 4. The distance between the adjacent ends of foil 4 and foil 14 is bridged by rectangular diaphragm 16, thus constituting a movable section of ground plane which is conductively connected by soldering to the stationary sections, foil 4 and foil 14. Driving coil form 18 is cemented or otherwise fixed to diaphragm 16. Driving coil 20, with terminals 22 and 24, is wound on and cemented to form 18, the assembly being immersed in the magnetic field existing in the gap between N and S poles of a permanent magnet 26. Brackets 28 and 30 attach dielectric board 2 rigidly to magnet 26. A control current applied to coil terminals 22 and 24 thus produces a force on diaphragm 16, causing it to deflect.

Figure 4:
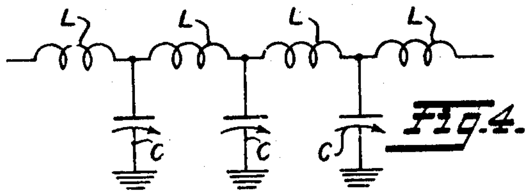
FIG. 4 is a schematic R.F. circuit diagram of the device.
Figure 3:
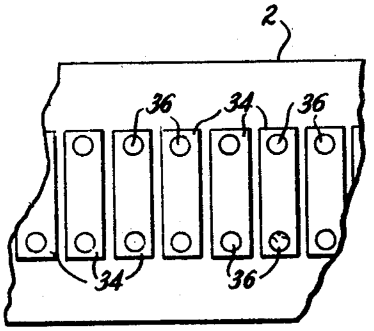
FIG. 3 is a bottom view of a portion of the printed circuit dielectric board of FIG. 1 showing capacitor plates.
Figure 5:
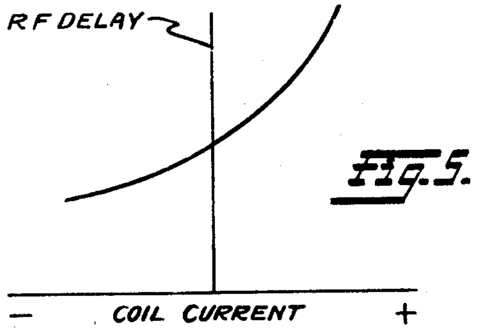
FIG. 5 is a graph showing the manner in which the R.F. delay varies with the control current applied to the driving coil.

Spiral inductance coils 32 are produced by conventional printed circuit etching techniques on the upper surface of dielectric board 2. Spaced rectangular capacitor plates 34 are produced in a like manner on the bottom surface of dielectric board 2, as shown in FIG. 3 which is a bottom view of a portion of board 2. Flat-headed rivets or eyelets 36 make conductive connection between each terminal of coils 32 and the corresponding capacitor plate 34 under it. Each capacitor plate 34 is in close proximity to the movable ground plane diaphragm 16. The R.F. circuit diagram thus is as shown in FIG. 4, taking the form of an artificial transmission line or low-pass filter with fixed inductance element, L, and variable capacitance elements, C.

It is well known that the time delay per section for such a line is given by $$T=\sqrt{LC}\text{ seconds}$$

if L and C are respectively inductance in henries, and capacitance in farads. Since capacitance, C, is made variable by motion of diaphragm 16, the time delay encountered by an R.F. signal propagated through the device is also variable, the total change in time delay depending on the change in capacitance, C, and on the total number of sections in the device.

Capacitance, C, may be calculated to reasonably good accuracy from the formula $$C=8.85A/(x_0-x)10^{-12}\text{ farads}$$

where $A$=plate area in sq. meters.
$x_0$=plate to diaphragm gap, resting position, in meters.
$x$=diaphragm deflection, upwards, in meters.

The deflection, $x$, is produced as a result of a control current $i$, applied to driving coil 20.

$$x=Bli/K,\text{ in meters}$$

where $B$=magnetic field in webers/sq. meter.
$l$=total length of winding immersed, in meters.
$i$=control current, in amps.
$K$=diaphragm stiffness, in newtons/meter.

The resultant R.F. delay as a function of driving coil current produces upwards deflection of the diaphragm.

It is apparent that the characteristic impedance $Z_0=\sqrt{L/C}$ is also variable in this device. This is not a desirable quality in a variable delay line; however, it will be found that the deflection of diaphragm 16 becomes progressively less approaching the extremities which are firmly fixed to board 2. The end sections therefore, are subject to less change in characteristic impedance than the middle ones. Thus it is possible always to have a smooth transition through the end sections which maintain $Z_0$ nearly equal to the nominal value for the strip line itself.

The capability of very quick response in this device may be explained as follows: It will be readily understood that the undamped natural period of the movable part is given simply by the formula $$P=2\pi\sqrt{m/K}$$

where $P$=the undamped natural period, in secs.
$m$=total mass of moving part, in kilogms.
$K$=spring stiffness of the diaphragm, in newtons/meter.

The total mass, $m$, is made up of diaphragm 16, coil form 18 and coil 20 plus the cement or other means used to fasten them together. These parts can be designed to have relatively low mass, thus contributing to a small value of natural period P. The spring stiffness, K, may be defined as follows:

$$K=F/x$$

where $F$=the force applied by driving coil, in newtons.
$x$=deflection of the diaphragm, in meters.

By suitable choice of the other dimensions, the distance, $x$, travelled by the movable diaphragm may be made arbitrarily small to achieve the desired variation in R.F. delay. Making this displacement small contributes to a relatively large value for diaphragm stiffness, K. The coil force, F, is made relatively large through the use of a field magnet of high flux density, and use of coil current as large as compatible with heating and mechanical limitations. These factors all contribute to a larger value for the diaphragm stiffness, K, thus further reducing the natural period, P. There is an alternate mode of operation in which the device functions as a variable cut-off low pass filter. It will be readily understood that if the frequency of R.F. signal is sufficiently increased, a point is reached where the signal is not passed through the structure. This cut-off frequency, $f_c$, is known by conventional filter theory to be given by $$f_c=1/\pi\sqrt{LC} \text{ in c.p.s.}$$

Since C is variable by the control means already described, the cut-off frequency $f_c$ is also variable. This implies that the device may be used as an amplitude modulator or switch by swinging the cut-off frequency above and below the chosen band of operating frequencies.

While a single specific embodiment of the invention has been shown and described herein, it is to be understood that other forms may be resorted to within the scope of the appended claims.

I claim:

1. An electrically controlled high speed variable transmission line comprising: a dielectric board; a plurality of spaced conductor strips on one face of said board, each strip defining an inductive device; a series of spaced conductive plates on the opposite face of said board; a plurality of conductors extending through said board and electrically connecting one end of each strip to one of said plates and the other end of the strip to an adjacent plate to define a first conductive path of alternating strips and plates; a flexible metal diaphragm mounted on said opposite face in opposed and outwardly spaced bridging relation to said series of plates but adjacent thereto, said diaphragm defining a second conductive path capacitatively related to said series of plates and having its ends fixed to said board; means for selectively flexing said diaphragm to vary the spacing of its midportion from said plates and thereby vary the capacitance between said second conductive path and said plates in accordance with the flexing thereof.

2. A transmission line as defined in claim 1 including; a permanent-magnet member; and a coil member in the flux field of said magnet, one of said members being movable and connected to an intermediate portion of said diaphragm; and means for conducting a signal current through said coil.

3. A transmission line as defined in claim 1 wherein said diaphragm is fixed to said opposite face closely adjacent the end plates of said series whereby the spacing therebetween does not change materially upon flexure of said diaphragm and the terminal impedance of said transmission line remains substantially constant.

4. A transmission line as defined in claim 1 including a second dielectric board overlying said conductor strips on said one face; a conductive layer covering the outer face of said second board; and means electrically connecting said conductive layer to said second conductive path.

References Cited in the file of this patent

UNITED STATES PATENTS

| | | |
|---|---|---|
| 1,785,297 | Cohen | Dec. 16, 1930 |
| 2,513,392 | Aust | July 4, 1950 |
| 2,751,558 | Grieg | June 19, 1956 |
| 2,811,698 | Slate | Oct. 29, 1957 |
| 2,820,206 | Arditi | Jan. 14, 1958 |
| 2,867,782 | Arditi | Jan. 6, 1959 |
| 2,890,424 | Arditi | June 6, 1959 |
| 2,916,711 | Gillen | Dec. 8, 1959 |
| 2,946,024 | Mills | July 19, 1960 |